United States Patent [19]

Henry

[11] 3,867,218

[45] Feb. 18, 1975

[54] METHOD OF ETCHING A PATTERN IN A SILICON NITRIDE LAYER

[75] Inventor: Loïc Henry, Caen, France

[73] Assignee: U.S. Philips Corporation, New York, N.Y.

[22] Filed: Apr. 25, 1973

[21] Appl. No.: 354,394

[52] U.S. Cl. ........................ 156/8, 156/17, 252/79.3
[51] Int. Cl. .......................... B29c 17/08, C09k 3/00
[58] Field of Search ................. 156/3, 8, 11, 13, 17; 148/187; 252/79.3, 79.2; 96/36.2; 29/580

[56] References Cited

UNITED STATES PATENTS 3,107,188 10/1963 Hancock .............................. 156/17

*Primary Examiner*—William A. Powell
*Attorney, Agent, or Firm*—Frank R. Trifari; Norman N. Spain

[57] ABSTRACT

Etching of a pattern in a silicon nitride layer provided on a substrate, in which the etching bath consists of a dilute aqueous solution of hydrofluoric acid and phosphoric acid, in which ammonium fluoride is dissolved in a high concentration. Application in the manufacture of semiconductor devices.

14 Claims, No Drawings

METHOD OF ETCHING A PATTERN IN A SILICON NITRIDE LAYER

The invention relates to a method of etching a pattern in a silicon nitride layer provided on a substrate, in particular for use in the manufacture of semiconductor devices.

As is known, such patterns of silicon nitride are used, for example, as a mask for the local diffusion of a doping in a semiconductor material so as to provide doped zones of a desired shape in the semiconductor material. It is also known to use silicon nitride patterns as a mask for etching and/or oxidizing semiconductor material, for example, to form therein grooves and/or insulation layers set in the semiconductor and consisting of the oxide of the semiconductor material, in particular silicon oxide. Such a pattern can also be used for local masking against atmospheric influences and as a local insulation, possibly locally as a dielectric, in a finished semiconductor device.

As compared with silicon dioxide used for said purposes, silicon nitride has the advantage of better masking than silicon dioxide, in particular for certain impureties, such as gallium and aluminum, which will penetrate through silicon dioxide. Such a silicon nitride layer also forms a better protection for the substrate against the action of the atmosphere, in particular during heating processes, notably against the action of oxygen and many other materials in gas form or vapour form having an oxidizing action. Such a layer can furthermore withstand the action of many aggressive etchants.

A consequence of the latter property is that the silicon nitride is also difficult to process. A known etchant for silicon nitride is hot orthophosphoric acid. Furthermore, concentrated hydrofluoric acid is also mentioned as an etchant for silicon nitride. However, phosphoric acid is also very aggressive and can thus attack other materials used, including also some semiconductor materials, in particular semiconductor materials of the III–V type, such as gallium-aluminum arsenide and gallium phosphide.

Conventional photoresists for defining a given pattern generally adhere only moderately to silicon nitride and are attacked or at least detached from the silicon nitride layer both by phosphoric acid and by concentrated hydrofluoric acid. Since orthophosphoric acid does not substantially attack silicon dioxide, a layer of silicon dioxide was provided on the silicon nitride layer on which in known manner the desired pattern was etched with the use of a photoresist pattern and hydrofluoric acid buffered with ammonium fluoride as an etchant. The resulting silicon oxide pattern was then used as a mask for etching the silicon nitride with hot orthophosphoric acid. This double etching treatment is less favourable for a sharp definition of the desired silicon nitride pattern.

It is also known presently to use a photoresist pattern direct on silicon nitride which has a masking effect during the etching treatment with hot phosphoric acid. For that purpose, either prior to the provision of the photoresist the silicon nitride surface is to be treated chemically, or the developed photoresist pattern is to be after-treated by heating or chemically so as to promote a good adhesion. So an extra intermediate step is necessary. Moreover, the after-treated resist pattern provided on the pretreated silicon nitride is difficult to remove afterwards due to its good adhesion to the substratum.

It is known from French Pat. No. 1,549,846 to etch a pattern in a silicon nitride layer by means of an etching liquid which consists of concentrated hydrofluoric acid only. The mask used is formed by a film of a refractory metal, for example, tungsten or molybdenum. The pattern should first be provided in the metal layer and then in the silicon nitride, which is less favourable for an accurate definition of the ultimate pattern in the silicon nitride layer. Furthermore, the manufacture of an accurately defined masking pattern from the above-mentioned refractory metals in itself is not easy.

Concentrated hydrofluoric acid is also very agressive and considerably attacks several materials, including most of the semiconductor materials of the III–V type. For example, concentrated hydrofluoric acid cannot be used in the presence of gallium-aluminum arsenide or gallium phosphide.

It is the object of the invention to provide a method of etching a pattern in silicon nitride which mitigates the above-mentioned drawbacks at least partly.

The invention is inter alia based on the recognition of the fact that the adhesion of the resists which are generally used for masking in chemically etching patterns, is improved if the etching bath in which they are dipped contains less water or if said water is physically bound to other constituents of the said medium.

According to the invention, a method of the type described in the preamble is characterized in that for the local etching of the silicon nitride an etching bath is used which contains hydrofluoric acid, ammonium fluoride, phosphoric acid, and water in quantities in which the bath forms a dilute acid solution with a high ammonium fluoride content.

Although the bath according to the invention contains hydrofluoric acid and phosphoric acid, it nevertheless has the advantage that direct use may be made of a film of a photoresist as an etchant-resistant mask directly on the silicon nitride layer without it being necessary to give the surface of the nitride a special treatment prior to the application of the resist, or to give the resist itself, after its application, a special after-treatment so as to increase its adhesion and its resistance against the action of the etching bath.

It has been found that the bath used in the method according to the invention, besides a considerable action on the silicon nitride, has no adverse influence on the masks of positive or negative photoresists used.

The sensivity of the conventional photoresists to water has been mentioned above. The presence of free water stimulates the detachment of the resist from its substratum, in particular in an acidic medium which contains hydrofluoric acid.

A high concentration of ammonium fluoride in the liquid of the etching bath can reduce the aggressiveness of the hydrofluoric acid and the phosphoric acid, said aggressiveness being already attenuated by the presence of water, and may modify the pH value of the said bath to a desired value which is compatible with a sufficient activity with respect to the silicon nitride. Also the water molecules are physically bound to the ammonium fluoride molecules, their detrimental influence on the adhesion of the photoresist being inhibited.

The possibility of etching silicon nitride with the use of a photoresist mask which is applied directly to the surface of the silicon nitride results in a reduction of the number of operations: double masking is no longer necessary. Furthermore, no extra treatment of the nitride surface or of the photoresist is necessary.

Another advantage of the etching bath used in the method according to the invention is its activity at room temperature which enables the use of patterns of silicon nitride for a variety of semiconductor materials. It has been found that the etching bath may be used in the presence of any semiconductor compound of the type III–V and that the resultant silicon nitride pattern has an excellent definition.

Furthermore it has been found that the activity of the etching bath on the silicon nitride does not differ essentially for silicon nitride layers prepared according to different methods, for example, a layer obtained chemically and a layer obtained by cathode sputtering.

It has been found that the etching bath used does not passivate the photoresist pattern on the silicon nitride so that said pattern, after the etching of the silicon nitride, can easily be removed. Also, prior to etching, an after-treatment of the photoresist pattern, for example, by the action of an organic material or by heating so as to increase the adhesion of the resist to silicon nitride, may be omitted. Such an after-treatment impedes the subsequent removal of the photoresist pattern after etching, in which case methods are to be used which may detrimentally affect the semiconductor material.

The composition of the bath may easily be adapted to the circumstances in which it is used, for example, to the type of a possibly present masking lacquer, the nature of the substrate and, in the given circumstances, to an optimum activity of the said bath. For example, in the possible presence of a masking lacquer, too high a concentration of hydrofluoric acid may involve the danger that the lacquer disappears and the underlying silicon nitride will be attacked, while an excessive quantity of water might also lead to detachment of such a layer unless the quantity of ammonium fluoride is increased proportionally, which however, would reduce the activity of the bath.

With the addition of ammonium fluoride, the bath may be buffered at a pH of approximately 4.5, which value has proved suitable for practical purposes.

Suitable compositions of the etching bath are preferably chosen within limits corresponding to solutions obtained by the combination of a quantity of concentrated hydrofluoric acid (approximately 50% by weight of HF) between 7 and 13 parts by volume (preferably between 9 and 11 parts by volume), a quantity of water between 26 and 34 parts by volume (preferably between 28 and 32 parts by volume), and a quantity of orthophosphoric acid (100%) between 1 and 10 parts by volume (preferably up to 8 parts by volume), and dissolving therein at least 60 gms (preferably at most 80 gms) of ammonium fluoride per 100 $cm^3$ of the resulting mixture of HF, water and $H_3PO_4$.

The addition of a comparatively small quantity of orthophosphoric acid already contributes to increasing the etching rate without any semiconductor material on which the silicon nitride layer may be provided being attacked and without a possibly used lacquer film detaching from its substratum. In the above-mentioned compositions, at least approximately 3 parts by volume of orthophosphoric acid are preferably used.

For example, with baths of compositions within the above-stated limits, the silicon nitride may be etched at room temperature at rates of on an average 0.0020 μm/minute if the quantity of orthophosphoric acid used is 4 parts by volume and at rates of on an average 0.0035 to 0.0040 μm/minute if said quantity of orthophosphoric acid is 8 parts by volume. Although such rates may seem small as compared with those which could be obtained with concentrated orthophosphoric acid, it should be kept in mind that when using concentrated orthophosphoric acid one is compelled to form a double masking pattern before proceeding to etching the silicon nitride, which requires a comparatively long treatment time, not counting other drawbacks associated with concentrated orthophosphoric acid, for example, when using certain semiconductor materials, such as compounds of the III–V type, in particular gallium aluminum arsenide and gallium phosphide which are very rapidly dissolved by hot concentrated orthophosphoric acid.

It is to be noted that the omission of the addition of orthophosphoric acid from the above-stated bath compositions would cause the average etching rate to decrease to on an average 0.0011 μm/minute.

If such a large quantity of orthophosphoric acid were added that the buffer effect would be destroyed at least partly, in which the pH value would be reduced to 3.5 or even 3, then the possibility exists that any lacquer film used detaches from the silicon nitride.

The etching method of a layer of silicon nitride used according to the invention is preferably carried out in a simple manner so that said thin layer is covered with a lacquer pattern, in particular a film of a photopolymerisable lacquer, which is patterned to the desired shape according to known photographic methods, after which the silicon nitride layer, at those areas where it is not covered by the masking pattern, is etched away by means of an etching bath to be used according to the invention. The method according to the invention is preferably applied to a substrate which contains semiconductor material, in particular a semiconductor compound of the III–V type. The method according to the invention can even be used with substrates with gallium aluminum arsenide and gallium phosphide. In this manner it has become possible to use the silicon nitride layer direct on the semiconductor, in particular on the last-mentioned semiconductor materials. The invention furthermore relates to a semiconductor device manufactured by using the method according to the invention.

According to one embodiment, a layer of silicon nitride, 0.1 μm thick, is provided on a substrate of gallium aluminum arsenide, locally etched with an etching bath of the following composition: concentrated hydrofluoric acid (50% by weight of HF): 10 parts by volume; distilled water: 30 parts by volume; concentrated orthophosphoric acid (100% of $H_3PO_4$): 3 parts by volume; crystalline ammonium fluoride ($NH_4F$): 70 gms per 100 $cm^3$ of the mixture of HF, water and $H_3PO_4$.

A time of 60 to 80 minutes is necessary for etching away the silicon nitride from the free surface parts throughout the thickness of the layer, which corresponds to an average etching rate of approximately 0.0015 μm/minute.

The following method may be followed for preparating such an etching bath: into a container having a given quantity of distilled water, suitable quantities are poured, first of concentrated hydrofluoric acid and then of concentrated orthophosphoric acid. Ammonium fluoride crystallized in the formed liquid is then dissolved until said solution is saturated with it, that is to say that undissolved fluoride remains on the bottom of the container. The bath is then "buffered" to a pH value of 4.5.

What is claimed is:

1. A method of etching a pattern in a silicon nitride layer provided on a substrate, in particular for use in the manufacture of semiconductor devices in which the substrate contains semiconductor material, said method comprising applying to desired portions of the silicon nitride layer an etching bath which contains hydrofluoric acid, ammonium fluoride, phosphoric acid, and water in quantities in which the bath forms a dilute acid solution with high ammonium fluoride content.

2. A method as claimed in claim 1, characterized in that the composition of the etching bath corresponds to a solution obtained by combining a quantity of concentrated hydrofluoric acid (50% by weight of HF) between 7 and 13 parts by volume, a quantity of water between 26 and 34 parts by volume, and a quantity of concentrated orthophosphoric acid (100% of $H_3PO_4$) between 1 and 10 parts by volume, and dissolving therein at least 60 gms of ammonium fluoride per 100 $cm^3$ of the resulting mixture.

3. A method as claimed in claim 2, characterized in that the quantity of concentrated hydrofluoric acid is 9 to 11 parts by volume.

4. A method as claimed in claim 3, characterized in that the quantity of water is 28–32 parts by volume.

5. A method as claimed in claim 4, characterized in that at most 80 gms of crystalline ammonium fluoride is used per 100 $cm^3$ of the mixture.

6. A method as claimed in claim 5, characterized in that the quantity of orthophosphoric acid is at most 8 parts by volume.

7. A method as claimed in claim 5, characterized in that the quantity of orthophosphoric acid is at least approximately 3 parts by volume.

8. A method as claimed in claim 7, characterized in that the quantity of orthophosphoric acid is at least 4 parts by volume.

9. A method as claimed in claim 2, characterized in that a masking pattern of a photoresist is formed directly on the silicon nitride layer and the etching treatment of the silicon nitride layer is carried out while using said masking pattern.

10. A method as claimed in claim 2, characterized in that the silicon nitride layer is provided on a substrate which contains a semiconductor material.

11. A method as claimed in claim 10, characterized in that the silicon nitride layer is provided directly on the semiconductor material.

12. A method as claimed in claim 9, characterized in that group III–V semiconductor material is used.

13. A method as claimed in claim 12, characterized in that gallium phosphide is used.

14. A method as claimed in claim 12, characterized in that gallium-aluminium arsenide is used.

* * * * *